(12) United States Patent
Dixit et al.

(10) Patent No.: US 6,355,558 B1
(45) Date of Patent: Mar. 12, 2002

(54) METALLIZATION STRUCTURE, AND ASSOCIATED METHOD, TO IMPROVE CRYSTALLOGRAPHIC TEXTURE AND CAVITY FILL FOR CVD ALUMINUM/PVD ALUMINUM ALLOY FILMS

(75) Inventors: Girish Dixit; Anthony Konecni, both of Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/332,362

(22) Filed: Jun. 10, 1999

(51) Int. Cl.$^7$ ............................................. H01L 21/44
(52) U.S. Cl. .................. 438/642; 438/680; 438/677; 438/648
(58) Field of Search ................... 438/688, 680, 438/681, 677, 672, 642, 643, 644, 648, 656, 974

(56) References Cited

U.S. PATENT DOCUMENTS

| 5,266,521 A | * | 11/1993 | Lee et al. | |
|---|---|---|---|---|
| 5,877,087 A | * | 3/1999 | Mosley et al. | 438/656 |
| 5,950,108 A | * | 9/1999 | Wu et al. | 438/685 |
| 6,080,665 A | * | 6/2000 | Chen et al. | 438/653 |

OTHER PUBLICATIONS

M. Sekiguchi et al "Self–aligned barrier layer formation on TiSi2 layer with N2 plasma treatment" 1996 Proc 13th Int. VLSI Multilevel Interconn. Conf. (VMIC) p. 180, Jun. 1996.*

* cited by examiner

*Primary Examiner*—Caridad Everhart
(74) *Attorney, Agent, or Firm*—Jacqueline J. Garner; W. James Brady, III; Frederick J. Telecky, Jr.

(57) ABSTRACT

A metallization structure, and associated method, for filling contact and via apertures to significantly reduce the occurrence of microvoids and provide desirable grain orientation and texture. A modified barrier structure is set forth for contact apertures, and a modified liner structure is set forth for via apertures. The metallization fill structure for contact apertures includes a first wetting or glue layer of refractory metal on the contact aperture, a layer of TiN on the first wetting layer, a second wetting layer of plasma-treated refractory metal on the barrier layer, a layer of CVD Al on the second wetting refractory metal layer, and a PVD Al alloy to fill the contact aperture. The fill structure for via apertures includes an initial plasma-treated refractory metal liner deposited on the via aperture. A CVD Al liner is positioned on the initial refractory metal liner. A PVD Al alloy layer is positioned on the CVD Al liner to fill the via aperture.

7 Claims, 6 Drawing Sheets

METALLIZATION STRUCTURE, AND ASSOCIATED METHOD, TO IMPROVE CRYSTALLOGRAPHIC TEXTURE AND CAVITY FILL FOR CVD ALUMINUM/PVD ALUMINUM ALLOY FILMS

FIELD OF THE INVENTION

This invention relates to semiconductor processing, and more particularly to a new and improved metallization structure, and associated method, for filling cavities while reducing or eliminating microvoids and improving grain texture.

BACKGROUND OF THE INVENTION

Multi-level semiconductor architectures create cavities, such as contact and via apertures, which have high aspect ratios. Aspect ratios range from less than 1.0 up to and greater than 10.0. High aspect ratio contact and via apertures are difficult to properly fill, or plug, with metal during the metallization process. The metallization process includes in part the application of first, or higher level, conductive material, typically a metal or sandwich structure of various metals.

There are several problems associated with the filling of contact and via apertures, including the formation of microvoids and the formation of undesirable grain texture in the metallization layers. Microvoids are formed in the metallization layer during the deposition of the metal layer into the contact or via aperture. The formation of microvoids occurs typically in high aspect ratio contact and via apertures, and is often due to shadowing from surrounding features or by the metal "pinching-off" at the top of the aperture before the lower portion of the aperture is adequately filled with the metal. The formation or enclosure of microvoids during the metallization process leads to downstream processing problems and long-term reliability issues. For instance, the microvoids can outgas during subsequent high temperature, or low vacuum, operations and disrupt processing layers surrounding the microvoid.

One common type of metallization process is the application of a blanket layer of chemical vapor deposition (CVD) aluminum (Al). However, blanket CVD Al films enclose microvoids in high aspect ratio features. In the case of blanket CVD Al, the microvoiding is believed due to improper nucleation. In addition, hot sputtered or reflowed aluminum alloys also typically enclose microvoids in high aspect ratio features. The enclosure of microvoids, in the case of hot sputtering, is believed due to the lack of a continuous wetting layer. Additionally, hot sputtered or reflowed aluminum alloys require high process temperatures which can negatively impact the performance of previously processed features.

The enclosure of microvoids in high aspect ratio contact and via apertures can be overcome by the use of a CVD titanium nitride (TiN) wetting layer underneath the CVD Al layer. The resulting metal fill of the aperture with this process is not always desirable as some microvoids are still enclosed. The CVD TiN film also leads to poor grain texture of the overlying CVD Al film. Poor grain texture, as measured by the full width at half maximum of XRF rocking curve analysis of Al (111) planes, can make the control and minimization of electromigration difficult.

It is with these shortcomings of the presently available technology in mind that the instant invention was developed.

SUMMARY OF THE INVENTION

One of the important aspects of the present invention relates to a metallization fill structure and associated method for contact and via apertures that significantly reduces the occurrence of microvoids, and provides desirable grain texture.

An optimized CVD/PVD hybrid metallization process is set forth herein with respect to both contact and via structures. The process includes in part the deposition of a refractory metal layer (on a barrier layer for contact structures), plasma treatment of the refractory metal layer, the in situ deposition of a thin layer of CVD Al, followed by PVD Al—Cu in situ deposition and in situ reflow at wafer temperatures <400° C. The highly-conformal CVD Al liner enables reflow at substantially lower temperatures than needed for the cold/hot reflow process and reduces the cost of adding CVD Al to the process sequence by utilizing very thin CVD Al films, which require only a small amount of precursor per wafer to deposit. As the vias are still open following CVD liner deposition, voids formed by subsequent closure during low pressure PVD deposition do not trap significant quantities of gas and are readily annealed away. This invention can be used as an integrated plug and interconnect solution for Al—Cu metallization that is extendible beyond the requirements of 0.25 micron processing. A thin CVD Al liner followed by PVD Al—Cu and reflow enables highly reflective, large-grained Al films to be deposited with superior electrical performance.

The fill structure for contact apertures includes a layer of an annealed refractory metal as a first wetting or glue layer on the contact aperture, an optionally fortified barrier layer of TiN on the first wetting layer, a second layer of plasma-treated refractory metal for improved wetting or nucleation on the barrier layer, a layer of aluminum (Al) applied to the second refractory metal layer by chemical vapor deposition (CVD), and an Al alloy applied to the underlying CVD aluminum by plasma vapor deposition (PVD) to fill the contact aperture. An anti-reflective coating can be applied on the Al alloy.

The fill structure for via apertures includes an initial refractory metal liner deposited on the via aperture in situ. Optionally, a refractory metal liner can be deposited on the via aperture ex situ. Both of these initial refractory metal liners are plasma-treated. A CVD Al liner is positioned in situ on the initial refractory metal liner. A PVD Al alloy layer is positioned in situ on the CVD Al liner to fill the via aperture. An anti-reflection coating can then be applied to the Al alloy.

A modified barrier structure is disclosed for contact apertures and a modified liner is disclosed for via apertures. This invention improves grain orientation and texture, and allows complete filling of high aspect ratio holes, cavities and trenches. The solution to the problem is found in the plasma treated refractory metal liners, and nitrogen lean refractory metal liners. The invention reduces interconnect stack height and achieves complete fill even for aspect ratios of greater than 3.5:1.

A more complete appreciation of the present invention and its scope can be obtained from the accompanying drawings, which are briefly summarized below, the following detailed description of presently preferred embodiment of the invention, and the appended claims.

DETAILED DESCRIPTION OF THE PREFERRED EMBODIMENT

Figure 1:
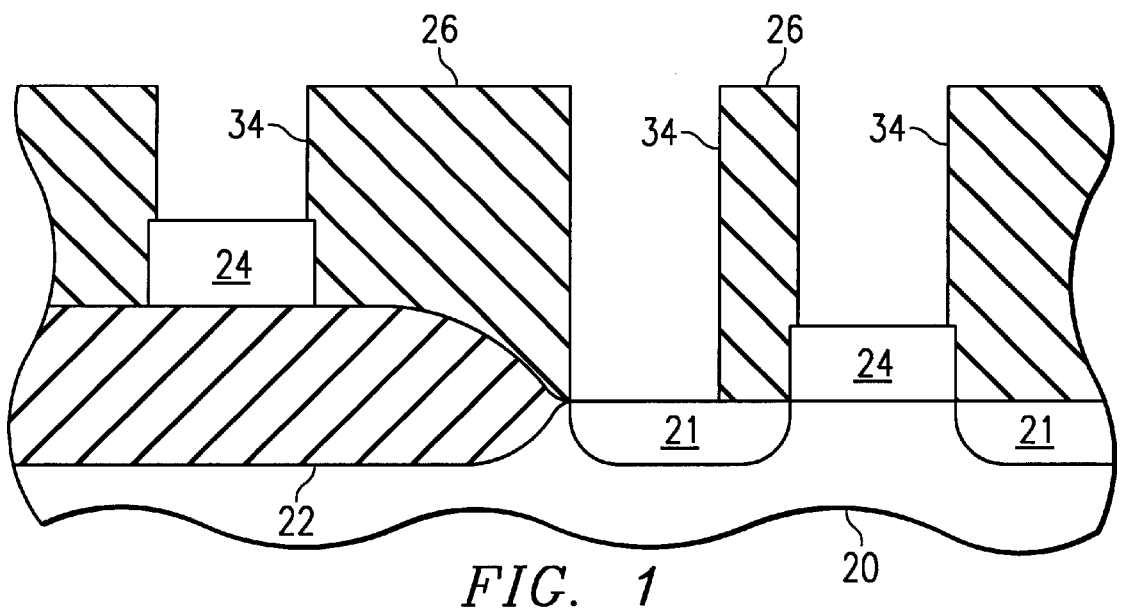
FIG. 1 is a representative section view of a partially manufactured integrated circuit prior to the first layer metallization process.

As shown in FIGS. 1–4, multi-level semiconductor structures typically include a silicon layer 20 (some portions 21 being doped), a silicon dioxide layer 22, a polysilicon conductor layer 24 selectively positioned to act as a conductor between certain features formed in the silicon layer, a first interlevel dielectric 26, a first metal layer 28 making selectively positioned connection to the underlying polysilicon 24 and silicon 20 layers through the first interlevel dielectric 26, a second level dielectric 30, and a second metal layer 32 making selectively positioned connection to the underlying first metal layer 28. A contact aperture 34 is a hole etched through the first interlevel dielectric 26, at a selected location, to open to typically the underlying silicon substrate 20 or the polysilicon features 24. The first metallization layer 28 is then applied to fill, or plug, the contact aperture 34 to make the required electrical connection through the contact aperture to the desired feature below. A via aperture 36 is a hole etched through a second 30 or higher level dielectric, at a selected location, to open to an underlying metallization layer 28. A second metal layer 32 is then applied to fill the via aperture 36 to make the required electrical connection through the via to the underlying first metallization layer 28. The first 26 and second 30 level dielectrics can be planarized by known methods to reduce the relief in the topography to some extent.

The instant invention pertains to a metallization structure for filling contact 34 and via 36 apertures (cavities) to reduce or minimize the enclosure and formation of microvoids, and to provide desirable grain texture of the deposited metal. A modified barrier structure 38 (See FIG. 2D) is described for contact apertures 34, and a modified liner structure 40 is described for via apertures 36. The use of plasma treated refractory metal liners and nitrogen lean refractory metal liners provides for the solution to the above problem by acting as nucleation layer for the following deposition of Al or other conductor material, such as copper or copper alloys.

Contact apertures 34 are formed through a first interlevel dielectric 26 to open to silicon and polysilicon features, as shown in FIG. 1. The first interlevel dielectric can be tetraethyl orthosilicate (TEOS), phosphorous silicate glass (PSG), boron silicate glass (BSG), borophosphorous silicate glass (BPSG), silicon dioxide, or the like. The contact aperture 34 is formed in any of a number of known processes.

One such process includes the steps of patterning the desired contact apertures in a photolithography step, and etching the exposed locations for the contact apertures in a reactive ion etch system, or a high-density plasma etch system. The contact etch process typically uses any or a combination of the following gases in known ratios at known pressure and power settings: CHF3, CF4, and Ar. The contact etch process provides a desired contact aperture profile, with a minimum dimension of about 0.18 microns, and an aspect ratio of up to approximately 10:1. Typical minimum contact dimensions are 0.3 microns, with an aspect ratio of 3.5:1. After the etch step is complete, the remaining photoresist is removed in an asher system, sometimes followed by a wet strip, oftentimes in sulfuric peroxide, and finished by a rinsing and drying procedure. The steps used to pattern the contact apertures, etch the interlevel dielectric to form the contact apertures, and remove the photoresist is not crucial to the instant invention, and any known process is suitable.

In the metallization structure of the present invention for filling the contact apertures, as shown in FIGS. 2A through 2F, a series of barrier metal structures are utilized to provide a wetting or glue layer to enhance the deposition of an Al alloy, which fills the contact aperture without, or with a reduced occurrence of, microvoids, and with a desirable final grain texture.

After the contact aperture etch process is completed, the first step in forming the desired metallization fill structure is to deposit titanium (Ti), or another refractory metal such as tungsten (W), as a wetting 42 or glue layer in the contact aperture. See FIG. 2A. This initial wetting layer of refractory metal is deposited in a thickness range of approximately 50 to 1000 Angstroms (Å). Preferably, the initial wetting layer refractory metal is deposited by sputtering, evaporation or CVD. This initial wetting layer refractory metal acts to reduce any native oxide formation at the bottom of the contact, getter any unwanted residue, and act as a sticking or nucleation enhancer for subsequent metallization efforts. Conventional CVD, sputtering or evaporative deposition techniques are acceptable for this layer.

A high temperature anneal is then performed. Preferably the high temperature anneal of the initial wetting layer of refractory metal is performed at greater than approximately 450 C, in either a furnace or by rapid thermal processing (RTP). The anneal can be performed in an atmosphere of $N_2$, forming gas, $H_2$, Ar, or a combination of these gases, to inhibit the growth of any oxides. The anneal should be performed in a pressure range from 20 mTorr to 760 Torr. The higher temperature anneal silicides the junction.

Following the high temperature anneal step, a barrier layer 44 of titanium nitride (TiN) is deposited by CVD, plasma vapor deposition (PVD), or high density plasma (HDP) PVD on the previous layer. See FIG. 2B. The TiN should be deposited to a thickness in the range of 50 Å to 1000 Å. This layer of TiN acts as a barrier material in order to stop or inhibit interaction between the subsequent metallization deposited and the underlying silicon. It also acts as a wetting/nucleation layer for subsequent metallization. Creases at the bottom corners of the contact apertures are a concern. However, the use of CVD TiN and HDP TiN or any other TiN deposition that provides sufficient bottom and sidewall coverage helps prevent problems associated with the formation of creases.

An optional barrier fortification step can then be performed to "stuff" the barrier layer to improve the performance of the barrier layer to keep the subsequently deposited Al from diffusing, or spiking, through the barrier layer into the underlying silicon (forming a eutectic alloy). The optional fortification step is performed by a high temperature anneal in Ar, $N_2$, $O_2$, $H_2$, or $NH_3$ atmospheres, or combinations thereof. These gases introduce impurities to the grain boundaries in the deposited metal and help restrict movement of the Al along the grain boundaries to reduce the occurrence of eutectic alloying.

A layer of refractory metal 46, preferably Ti, is then deposited to a thickness in the range of approximately 50 Å to 500 Å on the previous layer. See FIG. 2C. This layer of Ti provides improved nucleation sites or wetting to allow better adhesion of the CVD Al as opposed to the underlying TiN. This layer is the second wetting layer and the third layer of refractory metal. This in turn provides for an improved final grain texture after deposition of the Al alloy, as described below. In addition, the reflectivity of the Al alloy is improved. PVD, CVD or evaporative deposition techniques for this layer are acceptable.

This third layer of refractory metal is then treated with a plasma of $N_2$, $NH_3$, Ar or $O_2$, or any combination thereof. This step acts to nitride the refractory metal layer (Ti as above) and prevents formation of reactive products such as $TiAl_x$ with the Al. These $TiAl_x$ films are intermetallics that have a high resistivity and may cause electromigration problems. Also, the plasma treatment activates the surface of Ti to improve nucleation of CVD Al when it is deposited. The plasma treatment is also believed to nitride the surface of the Ti to develop up to approximately 100 Å of $TiN_x$. This layer of $TiN_x$ affects the interaction between the Ti and the CVD Al, and improves the characteristics of the CVD Al after being deposited on the third refractory layer of Ti. Problems with CVD Al morphology may occur if CVD Al is deposited directly on Ti without plasma treatment.

The plasma treatment is preferably an $N_2$ plasma formed under the following approximate conditions: 1 Torr, 350 Watts, a flow rate of 300 sccm, and a period of approximately 30 seconds. Acceptable ranges for these parameters in performing the $N_2$ plasma treatment are believe to be approximately: 0.5 to 2 Torr, 300–450 C, 350–750 Watts, 20–90 seconds, and 100–500 sccm flow rate. These values vary depending on the type of system used.

Next, a layer 48 of CVD Al is then deposited, preferably in situ, to a thickness in the range of approximately 100 Å to 1500 Å on the plasma-treated previous layer. See FIG. 2D. The CVD Al acts as a conformal wetting layer in the contact (or via aperture, as provided below) for the subsequent Al alloy deposition.

Nucleation layers for CVD Al films are critical for ensuring void-free fill, acceptable morphology, reflectivity, and texture. Smooth morphology (high reflectivity) is critical for the subsequent patterning steps of the metallization layer. A strong Al (111) texture is important for electromigration resistance. Thin CVD Al films deposited on Ti substrates have the highest reflectivity, while films on either PVD or CVD TiN result in lower reflectivity. Texture is also a strong function of the underlying nucleation layer. The plasma-treated Ti layer underlying the CVD Al film provides a desirable nucleation layer for the CVD Al.

An aluminum (Al) alloy 50, such as Al (0.5% Cu), is then deposited on the CVD Al, preferably in situ, to a thickness in the range of approximately 1500 Å to 15000 Å, preferably at a temperature range of approximately 200 C to 500 C. See FIG. 2E. The Al alloy is preferably deposited via plasma vapor deposition (PVD). The Al alloy deposited in this step acts to provide a complete fill, acting as a plug, of the contact aperture 34 with reduced or no enclosure of microvoids, while providing the desired grain texture. The reflow of the PVD Al during and after deposition is believed responsible for the complete fill of the contact aperture. Temperature and complete conformal coverage of CVD Al allow for a complete fill via bulk and surface diffusion during PVD deposition. The nucleation layers deposited in earlier steps also enhance the complete fill by the PVD Al. It is necessary to get complete surface and bulk diffusion following the PVD Al deposition in order to ensure a void free fill of the contact aperture.

Reflow occurs during and after the PVD Al deposition, during process times of approximately 30 seconds to several minutes, depending on the temperature. The temperature during the PVD Al deposition, for effective reflow, is in the range of approximately 300 C to 500 C, and is preferably 400 C. During the PVD Al deposition, reflow occurs by surface diffusion. After the PVD Al deposition is completed, the reflow occurs by bulk diffusion.

An anti-reflection coating 52 is then deposited on the PVD Al alloy to enhance the performance of the subsequent photolithography step, as is known in the art. See FIG. 2F. The anti-reflection coating can be TiN, TiN/Ti combination, or other refractory metal or bilayer of metals.

Figure 2A:
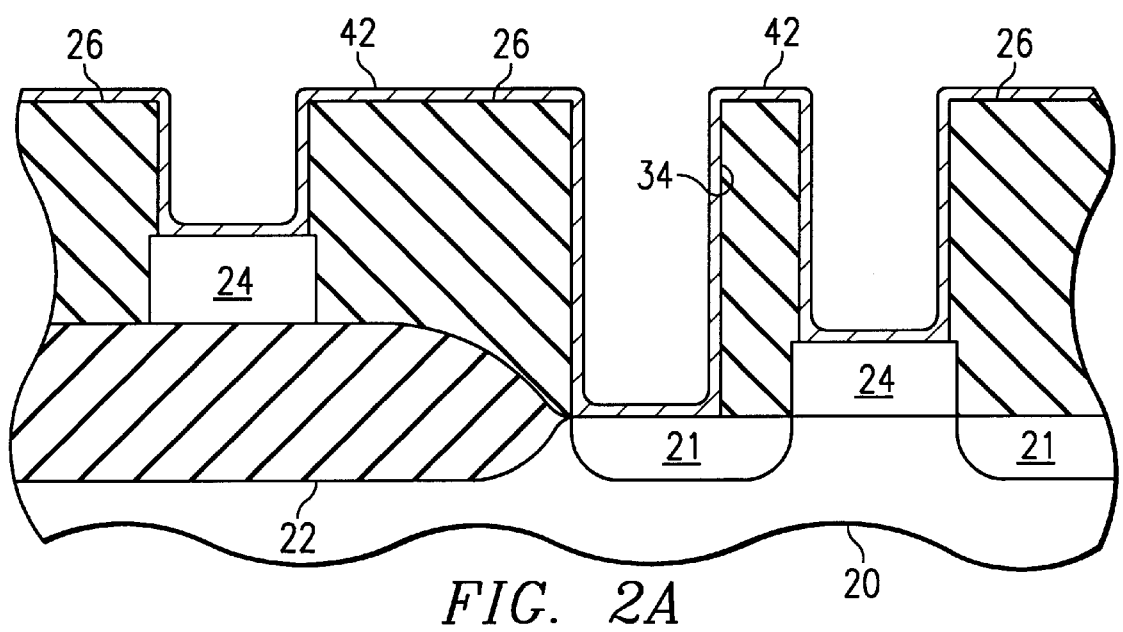
FIGS. 2A through 2F are a sequence of sections similar to FIG. 1 showing various stages in the first layer metallization process.
Figure 2B:
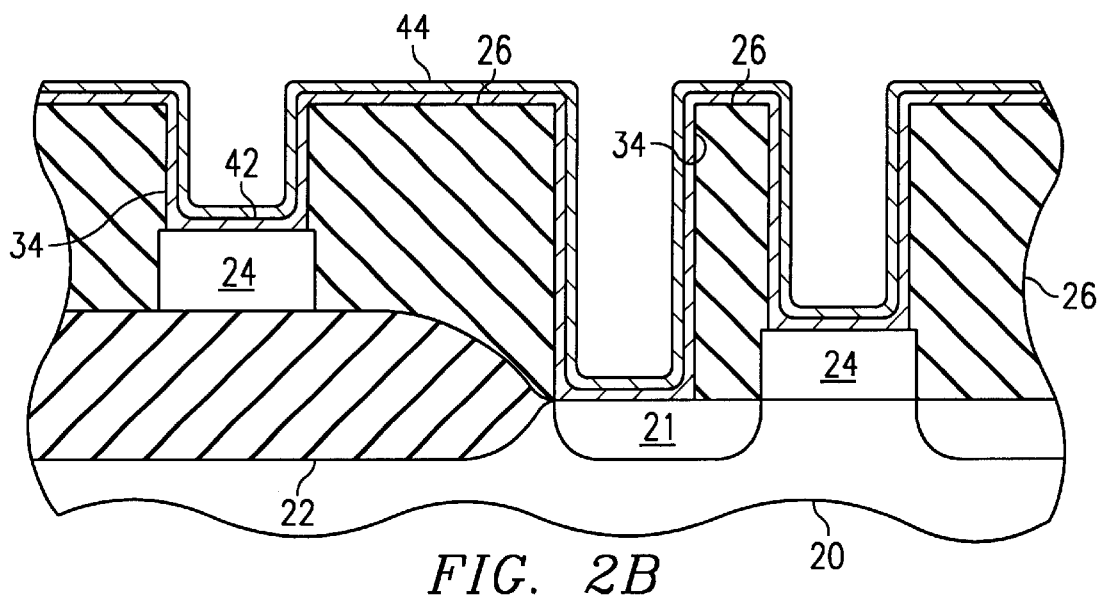
Figure 2C:
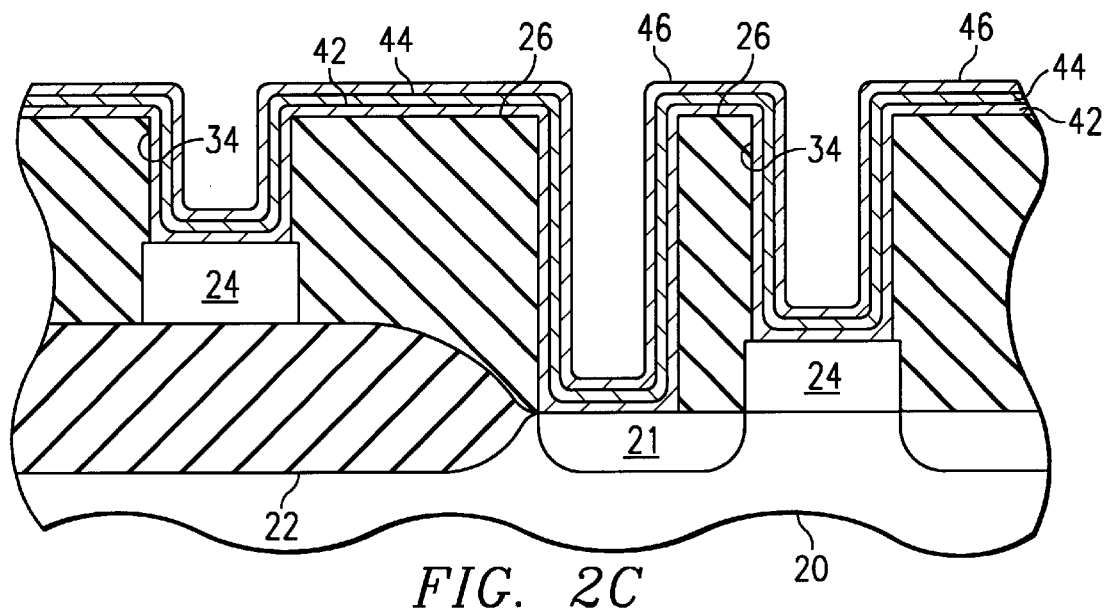
Figure 2D:
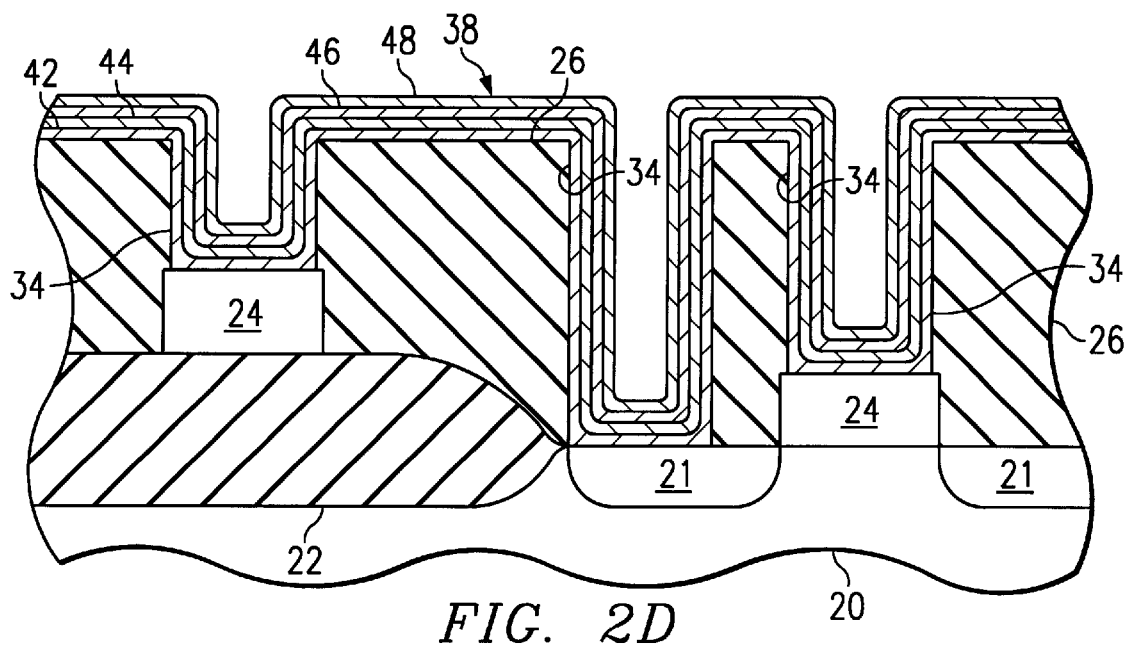
Figure 2E:
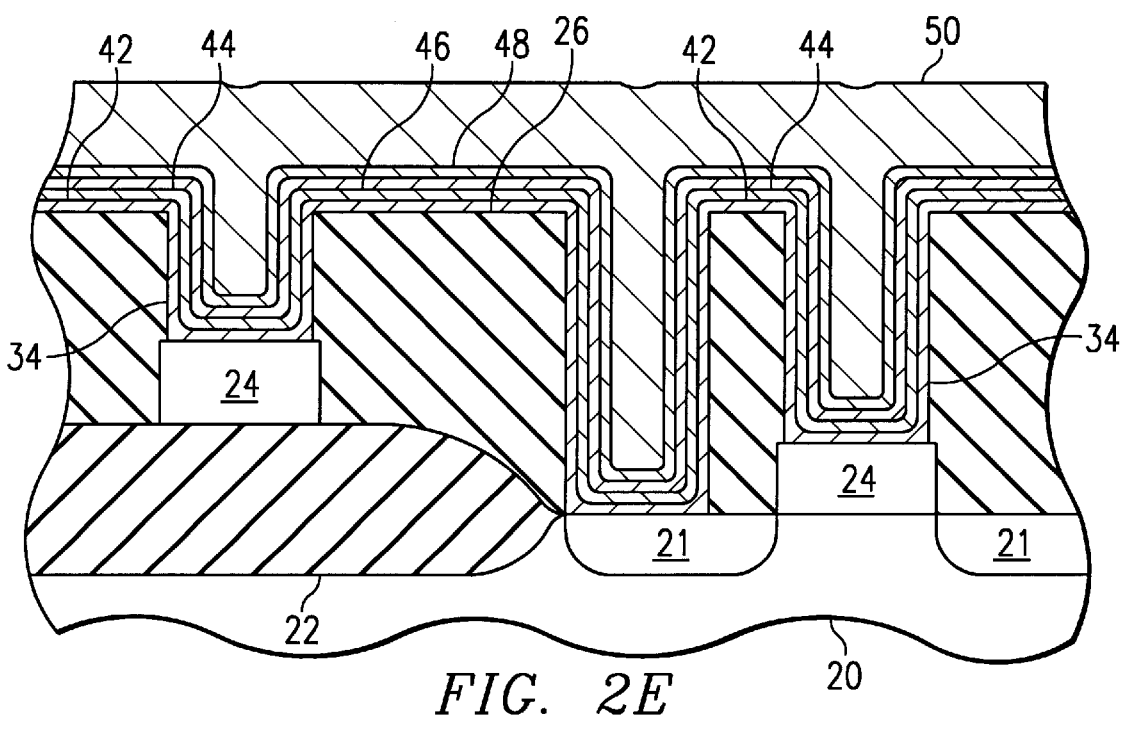
Figure 2F:
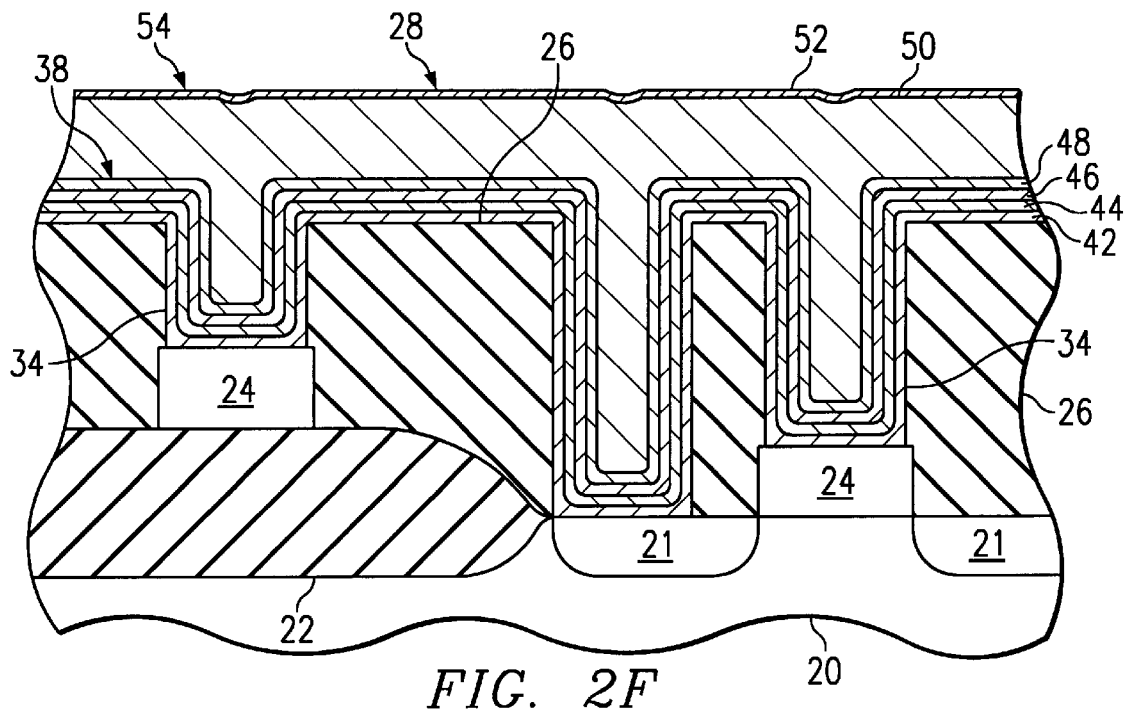

This metallization structure 54, shown complete in FIG. 2F, fills the contact apertures 34, and provides a complete fill while reducing the enclosure of undesirable microvoids, and also provides the desirable grain texture. The steps in creating the metallization structure 54 that greatly affect the complete fill are the plasma treatment of the underlying refractory metal layer, conformal deposition of a continuous CVD Al liner and resulting reflow that occurs during and after the PVD deposition.

Figure 3:
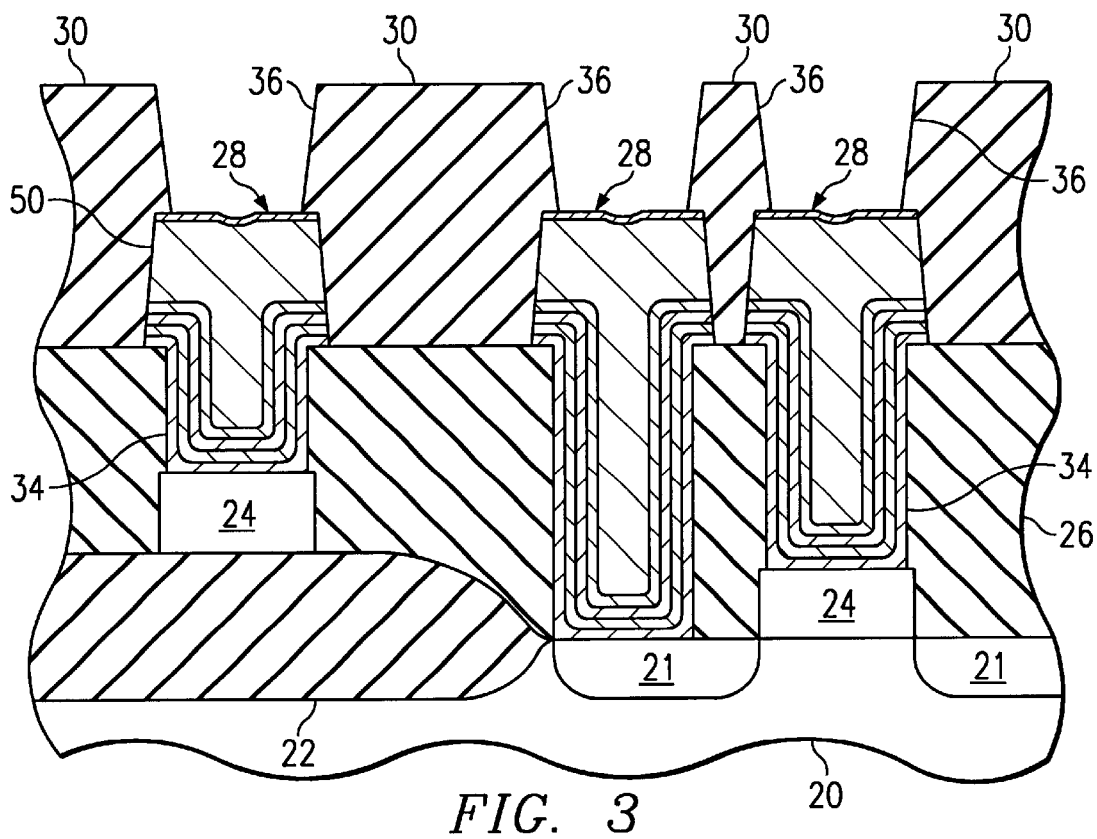
FIG. 3 is a representative section view of a partially manufactured integrated circuit prior to the second layer metallization process.

Via apertures 36 are formed through a second interlevel dielectric 30 to open onto underlying first layer metallization 28 features, as shown in FIG. 3. The second interlevel dielectric can be tetraethyl orthosilicate (TEOS), phosphorous silicate glass (PSG), boron silicate glass (BSG), borophosphorous silicate glass (BPSG), silicon dioxide, or the like. The via aperture 36 is formed by any of a number of known processes. One such process includes the steps of patterning the desired via apertures in a photolithography step, and etching the exposed locations for the via apertures typically in a reactive ion etch system. The via aperture etch process is analogous to the contact aperture etch process because they are both etching similar types of material. The second interlevel dielectric can be planarized to minimize topography. The via etch process provides a desired via aperture profile, with minimum dimensions of approximately 0.18 microns, and aspect ratios of up to approximately 10:1. Typically, a via aperture has a minimum dimension of approximately 0.3 microns, with an aspect ratio of approximately 3.5:1. After the via etch process is complete, the remaining photoresist is removed, and the process is finished by a rinsing and drying procedure. The process used to pattern the via apertures, etch the second interlevel dielectric to form the via apertures, and remove the photoresist are not crucial to the instant invention, and any known process is suitable.

In the metallization structure of the present invention for filling the via apertures 36, as shown in FIGS. 4A through 4F, a series of barrier metal structures are utilized to provide a wetting or glue layer to enhance the deposition of an Al alloy which fills the via aperture without, or with a reduced occurrence of, microvoids, and with a desirable grain texture in the metallization structure.

After the via aperture etch process is completed, as seen in FIG. 3, the first step in forming the desired metallization fill structure is to remove the oxide formed on the upper surface of the first metal layer during strip processes after etching the first metal layer, and after the etching process to open the via apertures. The oxide is removed from top of the first metal layer 28 at the bottom of the via apertures 36 by sputter etch, reactive ion etch, or a downstream plasma etch.

After the oxide is removed from the top of the first metal layer 28 at the bottom of the apertures, an initial refractory metal liner 56, such as Ti, is deposited, preferably in situ (without a vacuum break) in the via aperture. See FIG. 4A. The initial refractory metal liner 56 should be deposited to a thickness in a range of approximately 50 Å to 1000 Å.

Optionally, an initial refractory metal liner 56, such as Ti, TiN, or TiN$_x$ can be deposited ex situ (with a vacuum break) in the via aperture. This optional initial refractory metal liner should be deposited to a thickness in a range of approximately 50 Å to 1000 Å.

Next, an ex situ (with vacuum break) or in situ (without vacuum break) plasma treatment of the refractory metal liner 56 deposited above is performed. This plasma treatment is similar to that described above for the contact apertures. The plasma can be N$_2$, NH$_3$, Ar or O$_2$, or any combination thereof. Preferably, the plasma utilizes N$_2$. This step acts to nitride the refractory metal layer (Ti as above) and prevents formation of reactive products such as TiAl$_x$ with the Al. These TiAl$_x$ films are intermetallics that have a high resistivity. Also, the plasma treatment activates the surface of Ti to improve nucleation of CVD Al when it is deposited. The plasma treatment is also believed to nitride the surface of the Ti to develop up to approximately 100 Å of TiN$_x$. This layer of TiN$_x$ affects the interaction between the Ti and the CVD Al, and improves the characteristics of the CVD Al after being deposited on the third refractory layer of Ti. Problems with CVD Al morphology may occur if CVD Al is deposited directly on Ti without plasma treatment.

The plasma treatment is preferably an N$_2$ plasma formed under the following approximate conditions: 1 Torr, 350 Watts, a flow rate of 300 sccm, and a period of approximately 30 seconds. Acceptable ranges for these parameters in performing the N$_2$ plasma treatment are believe to be approximately: 0.5 to 2 Torr, 300–450 C, 350–750 Watts, 20–90 seconds, and 100–500 sccm flow rate. These values vary depending on the type of system used.

After the plasma treatment, a CVD Al liner 58 is deposited to a thickness in the range of approximately 100 Å to 500 Å on the plasma-treated previous layer. The CVD Al liner 58 is a wetting layer to allow adequate reflow of PVD Al. See FIG. 4B. In all cases CVD Al liner is preferred, however, deposition of any thin, continuous, conformal Al liner may be substituted for deposition. This CVD Al layer is similar to the CVD Al layer described above for the contact apertures.

A PVD Al alloy layer 60 is then deposited in situ on the CVD Al to a thickness in the range of approximately 1500 Å to 15000 Å, at a temperature of between 200 C to 500 C. See FIG. 4C. The PVD Al alloy completes the fill of the via aperture, acting as a plug, with a reduced or eliminated occurrence of microvoid formation, and provides the desired grain texture for subsequent processing. The PVD Al alloy layer is similar to the PVD Al alloy described above for the contact apertures.

An anti-reflection coating 62 is then deposited on the PVD Al alloy to enhance the performance of the subsequent photolithography processing, as is known in the art. See FIG. 4D. The anti-reflection coating can be TiN, TiN/Ti combination, or other refractory metal or bilayer of metals.

Figure 4A:
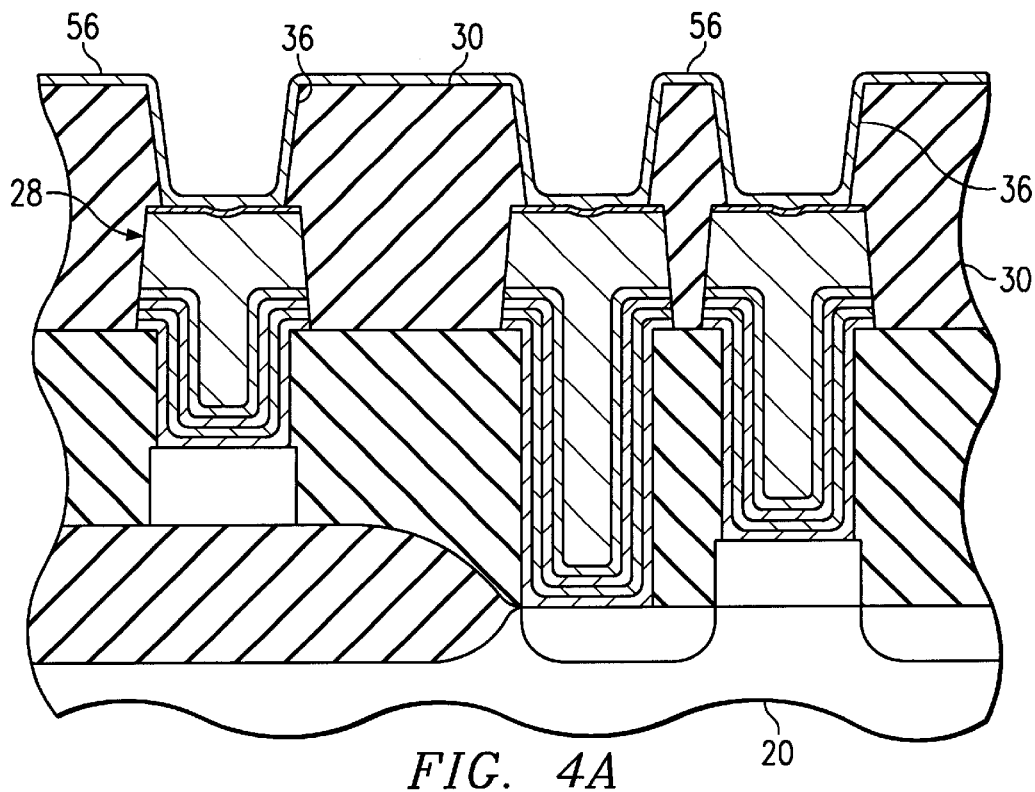
FIGS. 4A through 4D are a sequence of sections similar to FIG. 3 showing various stages in the second layer metallization process.
Figure 4B:
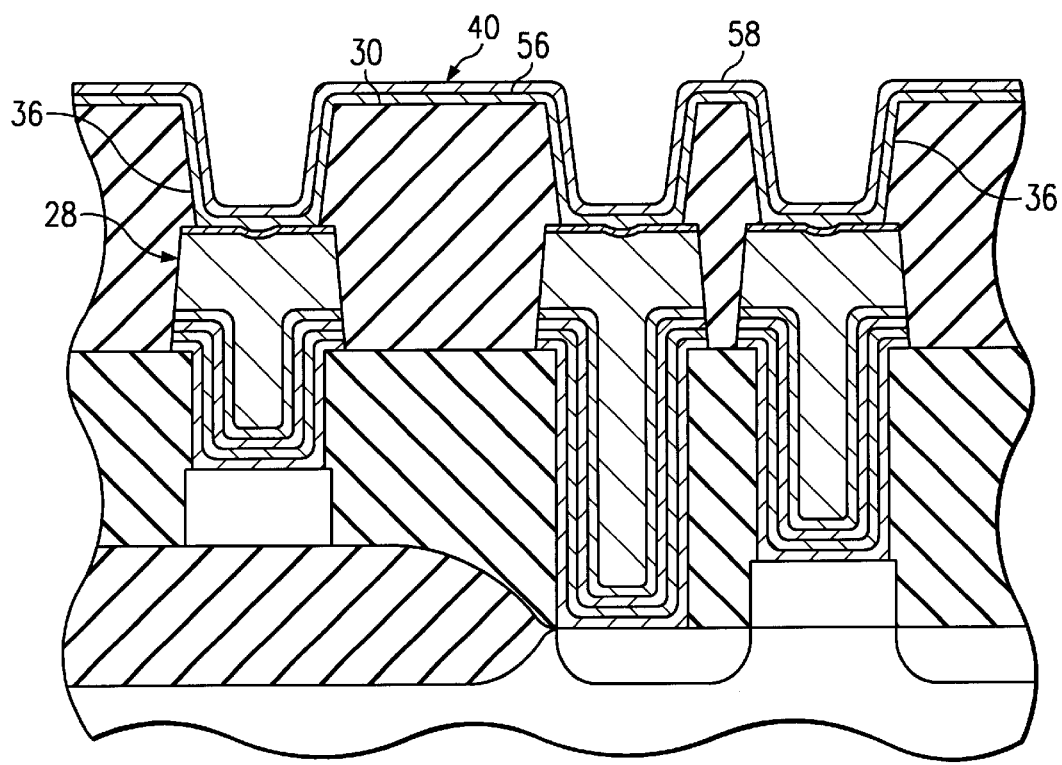
Figure 4C:
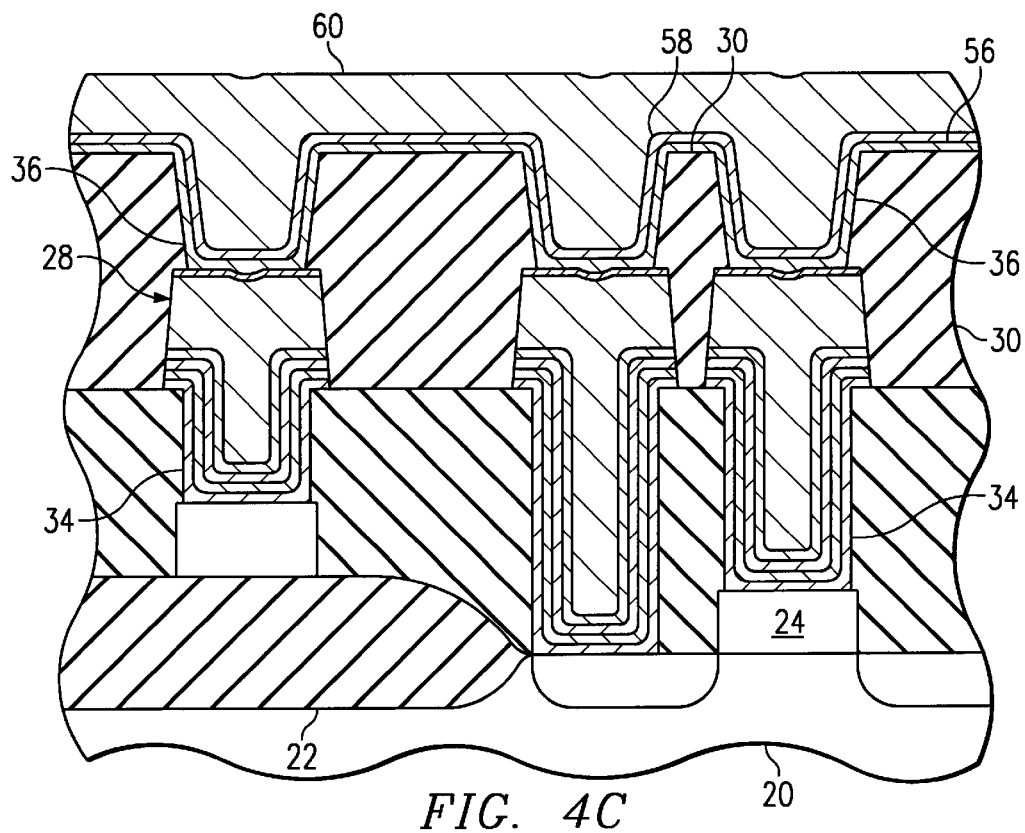
Figure 4D:
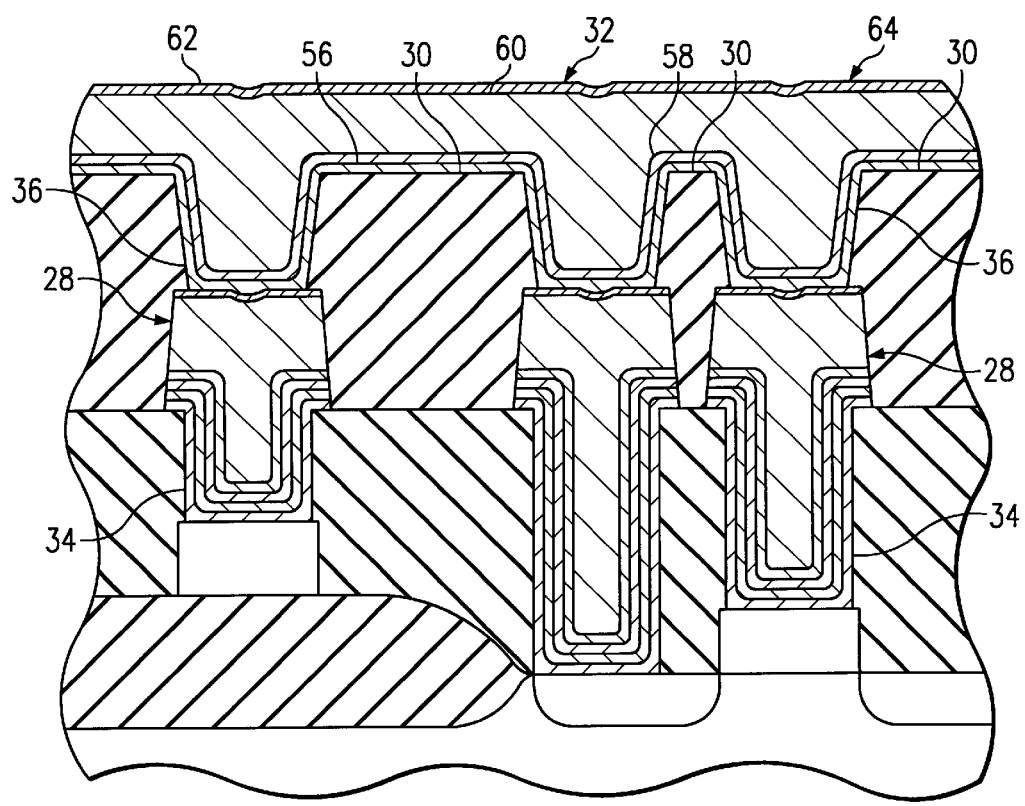

This metallization structure 64, shown complete in FIG. 4D, produced by the method described above fills the via apertures and provides a complete fill while reducing the enclosure of undesirable microvoids, and also provides the desirable grain texture. The steps in creating the metallization structure 64 that greatly affect the complete fill are the plasma treatment of the liner layer prior to the deposition of conformal, continuous liner of CVD Al, and the reflow occurring during and immediately following the PVD Al deposition.

Deposition of the PVD Al film onto the CVD Al liner results in the formation of a void. With further in situ annealing, bulk vacancy diffusion eliminates the void. Provided a thin, continuous CVD Al layer is deposited, and given a sufficient thermal budget, voids are readily annihilated in this process. If the CVD Al liner is too thick, the top of the via is bridged in the CVD Al chamber during blanket CVD Al deposition and the resulting void at the center of the via remains because of the pressure of residual gases trapped from the CVD Al deposition process. Alternately, if the CVD Al liner is too thin, or the choice of nucleation layer results in discontinuous sidewall coverage, reflow is inhibited and a void forms at the sidewall of the via where the wetting layer is absent. By optimizing the nucleation layer and CVD Al liner thickness, the plug-fill reliability is greatly improved.

Semiconductor structures utilizing CVD Cu and PVD Cu alloys can also be built to fill high aspect ratio contact and via apertures. Tantalum is sometimes used as a refractory metal liner, mostly where Cu and Cu alloys are utilized.

The advantages of the contact and via fill metallization structures 54 and 64 and associated method are that the usage of CVD aluminum is reduced, the exposure of the product to high-temperature processing is reduced, and thus generally provides a more manufacturable process. Importantly, microvoids in CVD aluminum liner/PVD aluminum alloy plug filler are significantly reduced or eliminated, and the grain texture is improved significantly compared to fill processes where CVD aluminum is used, or where PVD aluminum alloy is used on CVD TiN. Further advantages include that the above inventive processes can be used on the trench-type topography utilized in damascene and dual damascene type structures. These types of structures typically have high aspect ratios and would also benefit by this process. Interconnect stack heights are also reduced, and complete fill for apertures having aspect ratios of up to and greater than 3.5 can be achieved.

Presently preferred embodiments of the present invention and many of its improvements have been described with a degree of particularity. The previous description is of preferred examples for implementing the invention, and the scope of the invention should not necessarily be limited by this description. The scope of the present invention is defined by the scope of the following claims.

We claim:

1. A method for filling a contact aperture formed in a first interlevel dielectric, the method comprising the steps of:
   a. depositing a first wetting layer of a refractory material in the contact aperture;
   b. depositing a barrier layer on said first wetting layer;
   c. depositing a second wetting layer of a refractory material on said barrier layer;
   d. plasma treating said second wetting layer;
   e. depositing a layer of Al on said second wetting layer; and
   f. depositing a layer of Al alloy on said layer of Al, said layer of Al alloy to fill the contact aperture.

2. A method for filling a contact aperture formed in a first interlevel dielectric as defined in claim 1, wherein the step of plasma treating uses N$_2$ plasma.

3. A method for filling a contact aperture formed in a first interlevel dielectric as defined in claim 1, wherein the deposition of the Al layer is by CVD.

4. A method for filling a contact aperture formed in a first interlevel dielectric as defined in claim 1, wherein the deposition of the Al layer is in situ.

5. A method for filling a contact aperture formed in a first interlevel dielectric as defined in claim 1, wherein the deposition of the Al alloy layer is by PVD.

6. A method for filling a contact aperture formed in a first interlevel dielectric as defined in claim 1, wherein the deposition of the Al alloy layer is in situ.

7. A method for filling a contact aperture formed in a first interlevel dielectric as defined in claim 1, wherein the deposition of the Al layer is in situ and is by CVD, and the deposition of the Al alloy layer is in situ and by PVD.

* * * * *